(12) United States Patent
Tung et al.

(10) Patent No.: US 10,962,300 B2
(45) Date of Patent: Mar. 30, 2021

(54) COOLING DEVICE WITH A PRESSURE ADJUSTER

(71) Applicants: Inventec (Pudong) Technology Corp., Shanghai (CN); Inventec Corporation, Taipei (TW)

(72) Inventors: Kai-Yang Tung, Taipei (TW); Mao-Ching Lin, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 100 days.

(21) Appl. No.: 16/215,651

(22) Filed: Dec. 11, 2018

(65) Prior Publication Data

US 2020/0158443 A1  May 21, 2020

(30) Foreign Application Priority Data

Nov. 16, 2018 (CN) .......................... 201811364265.4

(51) Int. Cl.
*F28D 15/02* (2006.01)
*F28D 15/06* (2006.01)

(52) U.S. Cl.
CPC ....... *F28D 15/0266* (2013.01); *F28D 15/025* (2013.01); *F28D 15/06* (2013.01)

(58) Field of Classification Search
CPC ..... F28D 15/0266; F28D 15/025; F28D 15/06

USPC .......................... 165/104.27, 104.33, 104.32
See application file for complete search history.

(56) References Cited

U.S. PATENT DOCUMENTS

| 4,330,033 A * | 5/1982 | Okada .................... F25B 23/006 165/104.27 |
| 4,502,286 A * | 3/1985 | Okada .................... F25B 23/006 165/104.21 |
| 2002/0148594 A1* | 10/2002 | Gebhart ................ F28F 13/187 165/47 |
| 2003/0085024 A1* | 5/2003 | Santiago ............ B01D 19/0031 165/104.11 |
| 2020/0052356 A1* | 2/2020 | Eadelson ............ H01M 10/613 |

\* cited by examiner

*Primary Examiner* — Joel M Attey
(74) *Attorney, Agent, or Firm* — Winston Hsu

(57) ABSTRACT

A cooling device includes a sink, a first tube, a second tube, a heat exchanger, a pressure adjuster, and a dielectric liquid. The sink has a first outlet and a second outlet. The first tube has a first outlet connected to the first outlet of the sink, and a second outlet. The second tube has a first outlet connected to the second outlet of the sink, and a second outlet. The heat exchanger has a first outlet connected to the second outlet of the first tube, a second outlet connected to the second outlet of the second tube, and a third outlet. The pressure adjuster has an outlet connected to the third outlet of the heat exchanger. A heating element is placed in the sink and immersed in the dielectric liquid. The size of the pressure adjuster is defined by a volume of a vaporization status of the dielectric liquid.

8 Claims, 3 Drawing Sheets

COOLING DEVICE WITH A PRESSURE ADJUSTER

BACKGROUND OF THE INVENTION

1. Field of the Invention

The present invention relates to a cooling device, and more particularly, a cooling device with a pressure adjuster.

2. Description of the Prior Art

In engineering, it is a common requirement to cool a heating element to avoid overheating. For the purpose of cooling an element, the effect of heat dissipation can be improved by means of cooling fins, fans and adjustment of the shape of the element. For better improving heat dissipation, immersion cooling systems have been developed. When using an immersion cooling system of prior art, a heating element can be immersed in a volatile dielectric liquid, and the heat from the heating element can be dissipated to the liquid. Although an immersion cooling system can effectively improve cooling performance, it must be matched with the relevant surrounding structure.

The immersion cooling system of prior art can be a closed structure. When the heating element is immersed in the volatile dielectric liquid and starts to be cooled, vapor can be generated, and the vapor can enter a chamber for heat exchange. After the vapor is condensed, the condensed liquid can be dripped back by gravity into a holding space where the dielectric liquid is placed.

Some shortcomings of the structure have been observed in practice. When the dielectric liquid is converted from a liquid state to a gaseous state after volatilization, the volume of the vaporized dielectric liquid will increase, and an internal pressure will increase in the abovementioned closed structure. This increased internal pressure, will cause the vapor of the dielectric liquid to dissipate easily.

For example, in a portion of a connector for a signal line or a power line to pass through, vapor may escape more easily due to an excessive internal pressure. Therefore, a solution is required in the field to avoid vapor dissipation of the dielectric liquid.

SUMMARY OF THE INVENTION

An embodiment provides a cooling device including a sink, a first tube, a second tube, a heat exchanger, a pressure adjuster and a dielectric liquid. The sink includes a first holding space, a first outlet and a second outlet. The first tube includes a first outlet and a second outlet wherein the first outlet of the first tube is connected to the first outlet of the sink. The second tube includes a first outlet and a second outlet wherein the first outlet of the second tube is connected to the second outlet of the sink. The heat exchanger includes a second holding space, a first outlet, a second outlet and a third outlet wherein the first outlet of the heat exchanger is connected to the second outlet of the first tube, and the second outlet of the heat exchanger is connected to the second outlet of the second tube. The pressure adjuster includes a third holding space and an outlet wherein the outlet of the pressure adjuster is connected to the third outlet of the heat exchanger. The dielectric liquid is placed in at least the sink and the second tube. A heating element is placed in the sink and immersed in the dielectric liquid to dissipate heat from the heating element to the dielectric liquid. A size of the third holding space is defined by a volume of a vaporization status of the dielectric liquid.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
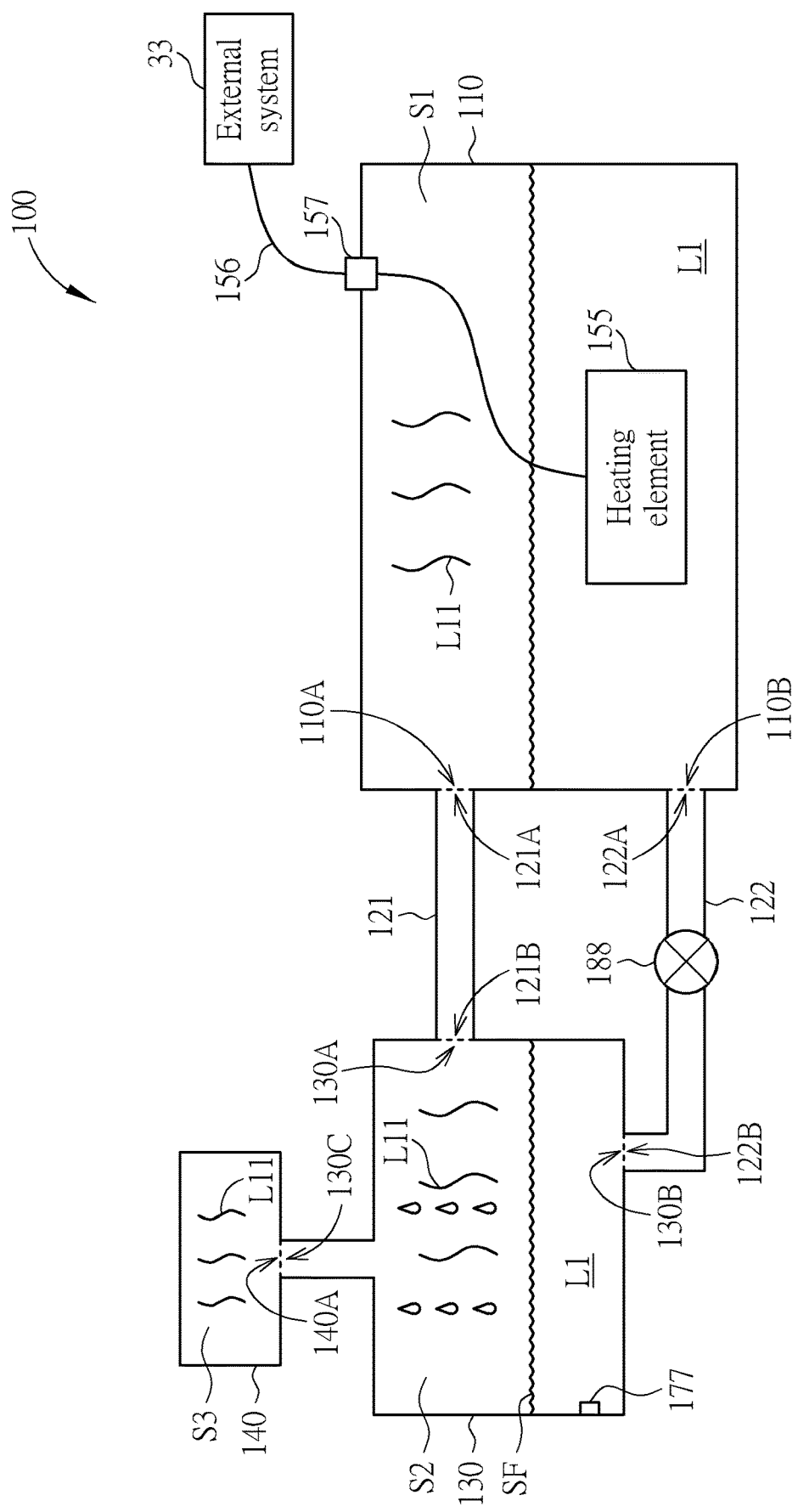
FIG. 1 illustrates a cooling device according to an embodiment.

FIG. 1 illustrates a cooling device 100 according to an embodiment. The cooling device 100 may include a sink 110, a first tube 121, a second tube 122, a heat exchanger 130, a pressure adjuster 140 and a dielectric liquid L1. The sink 110 may include a holding space S1, a first outlet 110A and a second outlet 110B. The first tube 121 may include a first outlet 121A and a second outlet 121B where the first outlet 121A is connected to the first outlet 110A of the sink 110. The second tube 122 may include a first outlet 122A and a second outlet 122B where the first outlet 122A is connected to the second outlet 110B of the sink 110. The heat exchanger 130 may include a holding space S2, a first outlet 130A, a second outlet 130B and a third outlet 130C where the first outlet 130A is connected to the second outlet 121B of the first tube 121, and the second outlet 130B is connected to the second outlet 122B of the second tube 122. The pressure adjuster 140 may include a holding space S3 and an outlet 140A where the outlet 140A is connected to the third outlet 130C of the heat exchanger 130. The dielectric liquid L1 may be placed in at least the sink 110 and the second tube 122. A heating element 155 may be placed in the first holding place S1 and immersed in the dielectric liquid L1 to dissipate heat from the heating element 155 to the dielectric liquid L1 for cooling. A size of the holding space S3 may be defined by a volume of a vaporization status of the dielectric liquid L1.

According to an embodiment, when the heating element 155 dissipates heat to the dielectric liquid L1, the dielectric liquid L1 may vaporize to generate vapor L11. The vapor L11 may enter the heat exchanger 130 through the first tube 121 and enter the pressure adjuster 140 through the outlet 140A. The size of the holding space S3 of the pressure adjuster 140 may increase for maintaining an internal pressure of the cooling device 100 when the internal pressure exceeds a threshold due to the vaporization status of the dielectric liquid L1. When the amount of the vapor L11 is reduced, the size of the holding space S3 may decrease to an original size. Hence, by means of the pressure adjuster 140 having an adjustable holding space S3, unwanted vapor dissipation caused by an exceed internal pressure may be avoided.

According to an embodiment, when the internal pressure in the cooling device 100 reaches a balanced status, the size of the holding space S3 of the pressure adjuster 140 may have a predetermined size. For example, when the cooling device 100 is just beginning to operate, the holding space S3 may be of a first size (e.g. 5 cubic centimeters). When the cooling device 100 has operated to reach a balanced status, the holding space S3 may increase to a second size (e.g. 107 cubic centimeters) since the amount of vapor L11 has increased. When the temperature of the heating element 155 decreases due to a lower operation load of the heating element 155, the holding space S3 may decrease to a third size (e.g. 76 cubic centimeters) since the amount of vapor L11 decreases. The abovementioned values are merely examples instead of limiting the scope of embodiments.

As shown in FIG. 1, the heating element 155 may be (but not limited to) a server, a processor, an operation circuit, a motor, a fan, a system chip, a voltage transformer and/or a device which dissipate heat due to operation. An external system 33 may be a system functionally connected to the heating element 155, and the external system 33 may be (but not limited to) an external circuit, an external server or a power supply system. The external system 33 and the heating element 155 may be connected to one another through a wire 156. The wire 156 may be used to transmit electrical power and/or signals. The wire 156 may be inserted to the sink 110 through a sealed connector 157. The dielectric liquid L1 may be a non-conductive liquid. For a better cooling effect, the dielectric liquid L1 may have a lower specific heat capacity and a lower boiling point.

When the vapor L11 condenses in the holding spaces S2 and S3 to become the dielectric liquid L1, and the condensed dielectric liquid L1 dripped back to the bottom of the heat exchanger 130, the dielectric liquid L1 may flow back to the sink 110 through the second tube 122, and the cooling operation may be repeated in a cycle. According to an embodiment, an inclination angle of the second tube 122 may be determined according to tests and calculations so as to adjust a flowing condition of the dielectric liquid L1 flowing to the sink 110.

According to an embodiment, the outlet 140A of the pressure adjuster 140 may be located on a bottom side of the pressure adjuster 140, and the heat exchanger 130 may be positioned below the pressure adjuster 140. When the vapor L11 condenses in the holding spaces S2 and S3, the process may be performed with natural cooling. In another case, an additional cooling means may be applied from outside of the heat exchanger 130 and/or the pressure adjuster 140 to further improve the cooling effect. For example, outside the heat exchanger 130 and/or the pressure adjuster 140, a fan may be used for cooling, or additional cooling means may be installed.

According to an embodiment, the dielectric liquid L1 may be further placed in the holding space S2. The cooling device 100 may further include a pump 188 used to pump the dielectric liquid L1 to the holding space S1 from the holding space S2 through the second tube 122. According to an embodiment, the pump 188 may be installed on the second tube 122. For example, the pump 188 may be installed on the second outlet 122B of the second tube 122 or another portion. By means of the pump 188, it is allowed to pump the dielectric liquid L1 with active control.

According to an embodiment, the cooling device 100 may further include a liquid level detector 177 used to detect a liquid level SF of the dielectric liquid L1 in the holding space S2. The liquid level detector 177 may be coupled to the pump 188 and further used to send a control signal to control the pump 188 according to the liquid level SF.

For example, the liquid level detector 177 may control the pump 188 to slow down or stop pumping the dielectric liquid L1 from the holding space S2 when the liquid level SF is lower than a lower threshold. In other words, the flowing amount of the dielectric liquid L1 pumped per unit of time may be reduced. In addition, the liquid level detector 177 may control the pump 188 to speed up pumping the dielectric liquid L1 when the liquid level SF is higher than an upper threshold. In other words, the flowing amount of the dielectric liquid L1 pumped per unit of time may be increased. When the liquid level SF is between the lower threshold and the upper threshold, the flowing amount of the dielectric liquid L1 pumped per unit of time may be kept substantially constant.

According to another embodiment, the abovementioned upper threshold may be equal to the lower threshold. In other words, when the liquid level SF is higher than a threshold, the pump 188 may speed up pumping the dielectric liquid L1. When the liquid level SF is lower than the threshold, the pump 188 may slow down pumping the dielectric liquid L1. The corresponding relationships between the liquid level SF and a pumping rate of the pump 188 may be set with a control program or a lookup table.

By means of the liquid level detector 177, it may be avoided that the pump 188 keeps pumping when the liquid level SF is excessively low. Hence, unnecessary pumping operations may be prevented, and damages caused by drawing air may be prevented. According to an embodiment, the abovementioned pump 188 and/or the liquid level detector 177 may be optionally used. In other words, the abovementioned pump 188 and/or the liquid level detector 177 may not be used according to engineering requirements for simplifying the device. By means of the pump 188 and the liquid level detector 177, the controllability of the cooling device 100 may be enhanced.

Figure 2:
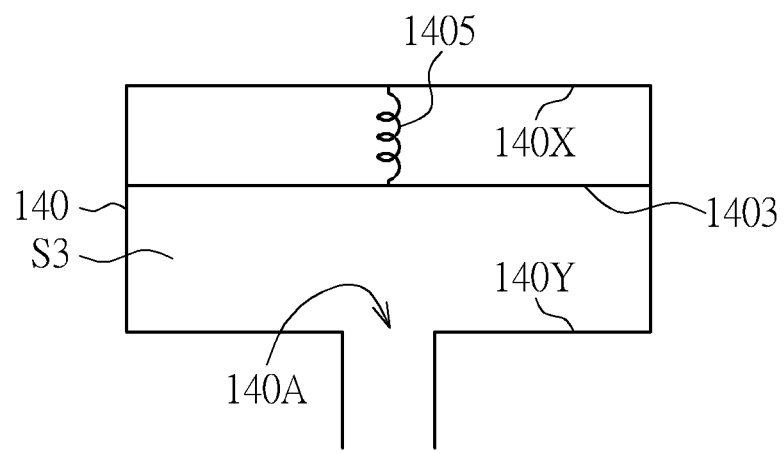
FIG. 2 to FIG. 4 illustrate the pressure adjuster of FIG. 1 according to different embodiments.
Figure 3:
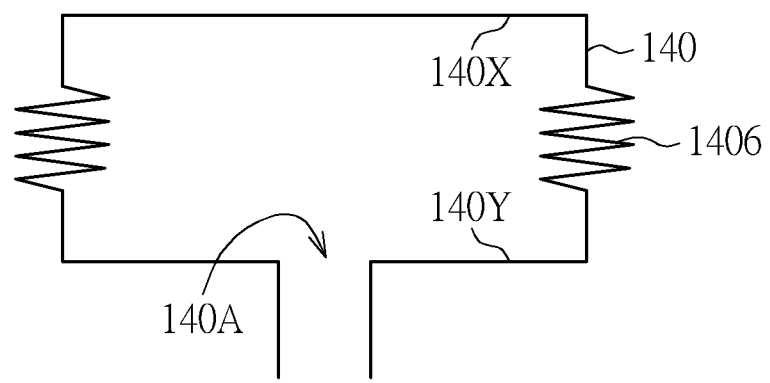
Figure 4:
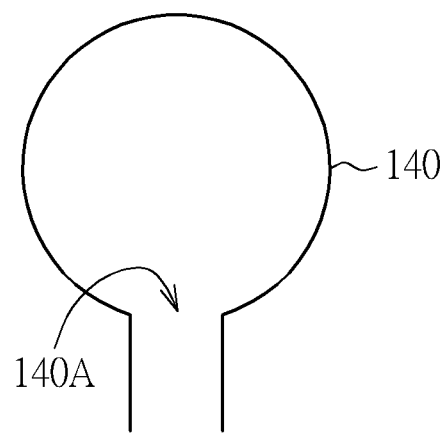

FIG. 2 to FIG. 4 illustrate the pressure adjuster 140 according to different embodiments. As shown by the embodiment of FIG. 2, the pressure adjuster 140 may include an upper inner wall 140X, a lower inner wall 140Y, a partition 1403 and an elastic unit 1405. The outlet 140A of the pressure adjuster 140 may be on the lower inner wall 140Y. The elastic unit 1405 may be disposed between the upper inner wall 140X and the partition 1403 and used to adjust a height of the partition 1403. The holding space S3 may be between the partition 1403 and the lower inner wall 140Y, and the size of the holding space S3 may be defined by the height of the partition 1403. The mentioned elastic unit 1405 may be a spring or a structure formed with another elastic material.

As shown by the embodiment of FIG. 3, the pressure adjuster 140 may have a bellow structure. The pressure adjuster 140 may include an upper inner wall 140X, a lower inner wall 140Y and a retractable side wall 1406. The retractable side wall 1406 may be disposed between the upper inner wall 140X and the lower inner wall 140Y and used to adjust a distance between the upper inner wall 140X and the lower inner 140Y wall adaptively. The size of the holding space S3 may be defined by a size of the retractable side wall 1406 where the size of the retractable side wall 1406 may relate to the level of retraction of the retractable side wall 1406.

As shown by the embodiment of FIG. 4, the pressure adjuster 140 may have a balloon structure. The pressure adjuster 140 may be a balloon body formed with an elastic material. The size of the holding space S3 may be defined by expansion or contraction of the balloon body.

The size and flexibility of the pressure adjuster 140 may be selected according to engineering requirements. For example, if the amount of vapor L11 may be higher according to calculations, the pressure adjuster 140 with a larger size may be selected. In addition, if the amount of the vapor L11 may change significantly, for example, the temperature of the heating element 155 may vary significantly, the pressure adjuster 140 with a greater flexibility may be selected.

In summary, by means of a cooling device provided by an embodiment, an excessive internal pressure in the device caused by the vaporization of the dielectric liquid may be effectively avoided, and unwanted vapor dissipation caused by an excessive internal pressure may be prevented. A cooling device provided by an embodiment may be useful for reducing the engineering problems in the field, and improving availability of a cooling device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cooling device comprising:
    a sink comprising a first holding space, a first outlet and a second outlet;
    a first tube comprising a first outlet and a second outlet wherein the first outlet of the first tube is connected to the first outlet of the sink;
    a second tube comprising a first outlet and a second outlet wherein the first outlet of the second tube is connected to the second outlet of the sink;
    a heat exchanger comprising a second holding space, a first outlet, a second outlet and a third outlet wherein the first outlet of the heat exchanger is connected to the second outlet of the first tube, and the second outlet of the heat exchanger is connected to the second outlet of the second tube;
    a pressure adjuster comprising a third holding space and an outlet wherein the outlet of the pressure adjuster is connected to the third outlet of the heat exchanger;
    a dielectric liquid placed in at least the sink, the second tube and the second holding space;
    a pump configured to pump the dielectric liquid to the first holding space from the second holding space through the second tube; and
    a liquid level detector coupled to the pump and configured to detect a liquid level of the dielectric liquid in the second holding space and send a control signal to control the pump to slow down or stop pumping the dielectric liquid when the liquid level is lower than a lower threshold;
    wherein a heating element is placed in the sink and immersed in the dielectric liquid to dissipate heat from the heating element to the dielectric liquid, and a size of the third holding space is defined by a volume of a vaporization status of the dielectric liquid.

2. The cooling device of claim 1, wherein the pump is installed on the second tube.

3. The cooling device of claim 1, wherein the liquid level detector further controls the pump to speed up pumping the dielectric liquid when the liquid level is higher than an upper threshold.

4. The cooling device of claim 1, wherein the size of the third holding space increases for maintaining an internal pressure of the cooling device when the internal pressure exceeds a threshold.

5. The cooling device of claim 1, wherein the outlet of the pressure adjuster is located on a bottom side of the pressure adjuster, and the heat exchanger is positioned below the pressure adjuster.

6. The cooling device of claim 1, wherein the pressure adjuster further comprises:
    an upper inner wall;
    a lower inner wall wherein the outlet of the pressure adjuster is on the lower inner wall;
    a partition; and
    an elastic unit disposed between the upper inner wall and the partition and configured to adjust a height of the partition;
    wherein the third holding space is between the partition and the lower inner wall, and the size of the third holding space is defined by the height of the partition.

7. The cooling device of claim 1, wherein the pressure adjuster further comprises:
    an upper inner wall;
    a lower inner wall; and
    a retractable side wall disposed between the upper inner wall and the lower inner wall and configured to adjust a distance between the upper inner wall and the lower inner wall adaptively;
    wherein the size of the third holding space is defined by a size of the retractable side wall.

8. The cooling device of claim 1, wherein the pressure adjuster is a balloon body formed with an elastic material.

* * * * *